United States Patent
Leobandung

(10) Patent No.: US 9,614,042 B2
(45) Date of Patent: Apr. 4, 2017

(54) HETEROJUNCTION TUNNEL FIELD EFFECT TRANSISTOR FABRICATION USING LIMITED LITHOGRAPHY STEPS

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/640,280

(22) Filed: Mar. 6, 2015

(65) Prior Publication Data

US 2016/0260806 A1  Sep. 8, 2016

(51) Int. Cl.
 *H01L 29/267* (2006.01)
 *H01L 29/08* (2006.01)
 *H01L 29/78* (2006.01)

(52) U.S. Cl.
 CPC ........ *H01L 29/267* (2013.01); *H01L 29/0847* (2013.01); *H01L 29/78* (2013.01)

(58) Field of Classification Search
 CPC .......................... H01L 29/267; H01L 29/0847
 See application file for complete search history.

(56) References Cited

U.S. PATENT DOCUMENTS

| | | | |
|---|---|---|---|
| 8,686,402 B2 | 4/2014 | Goel et al. | |
| 2002/0011613 A1* | 1/2002 | Yagishita et al. | 257/284 |
| 2012/0199814 A1 | 8/2012 | Berger | |
| 2013/0093497 A1 | 4/2013 | Lee et al. | |
| 2013/0313647 A1* | 11/2013 | Aquilino | H01L 21/82380 257/368 |
| 2015/0084133 A1* | 3/2015 | Xiao | 257/369 |

FOREIGN PATENT DOCUMENTS

| | | |
|---|---|---|
| EP | 1900681 A1 | 3/2008 |
| JP | 10050730 A | 2/1998 |
| JP | 2734435 B2 | 3/1998 |
| JP | 10107274 A | 4/1998 |
| JP | 2008103702 A | 5/2008 |
| JP | 2010283346 A | 12/2010 |

OTHER PUBLICATIONS

Avci et al., "Heterojunction TFET Scaling and Resonant—TFET for Steep Subthreshold Slope At Sub-9NM Gate-Length", 2013 IEEE, pp. 4.3.1-4.3.4.

* cited by examiner

*Primary Examiner* — Marc Armand
(74) *Attorney, Agent, or Firm* — Kristofer L. Haggerty

(57) ABSTRACT

A structure and method for fabricating a vertical heterojunction tunnel field effect transistor (TFET) using limited lithography steps is disclosed. The fabrication of a second conductivity type source/drain region may utilize a single lithography step to form a first-type source/drain region, and a metal contact thereon, adjacent to a gate stack having a first conductivity type source/drain region on an opposite side.

8 Claims, 13 Drawing Sheets

HETEROJUNCTION TUNNEL FIELD EFFECT TRANSISTOR FABRICATION USING LIMITED LITHOGRAPHY STEPS

BACKGROUND

The present invention relates generally to semiconductor fabrication, and more specifically, to a structure and method of fabricating a vertical heterojunction tunnel field effect transistor (TFET) using limited lithography steps.

Heterojunction TFET devices typically require asymmetric source/drain regions (i.e, opposite conductivity types), which are difficult to fabricate using conventional processes. Conventional heterojunction TFET fabrication techniques involve lithography processes that require the deposition, patterning, and removal of at least two different photoresist layers during the fabrication process. For example, a first lithography may occur prior to formation of the heterojunction TFET's source region. A second lithography may occur after the source region is formed but prior to the formation of an oppositely doped drain region.

Each incidence of the lithography process, including the photoresist deposition, patterning and etching processes associated with it, may subject semiconductor devices located on the semiconductor substrate to harsh processing conditions. This may result in a reduced yield of quality wafers from each manufactured batch and subsequent performance issues. Each lithography incidence may also increase the time duration and cost associated with the heterojunction TFET fabrication process.

SUMMARY

According to an embodiment, a method of forming a heterojunction tunnel field effect transistor (TFET) is provided. The method may include: forming a first-type source/drain region in a substrate adjacent to a first side of a gate stack, the first-type source/drain region having a first conductivity type; forming an interlevel dielectric (ILD) layer on the gate stack and the first-type source/drain region; and forming a second-type source/drain region in the substrate adjacent to a second side of the gate stack and a contact thereon using a single lithography step, the second-type source/drain region having a second conductivity type opposite that of the first-type source/drain region.

According to another embodiment, a method of forming a heterojunction tunnel field effect transistor (TFET) is provided. The method may include: forming a gate stack on a substrate; forming first-type source/drain regions in the substrate on either side of the gate stack; forming an interlevel dielectric (ILD) layer on the gate stack and the first-type source/drain regions; forming a first opening in the ILD layer to expose an upper surface of one of the first-type source/drain regions; removing the exposed first-type source-drain region to form a recess; forming a second-type source/drain region in the recess, the second-type source/drain region having an opposite conductivity type as the first-type source/drain regions; forming a first contact liner on the second-type source/drain region, the gate stack, and a vertical sidewall of the ILD layer; and forming a first contact on the first contact liner.

According to another embodiment, a heterojunction tunnel field effect transistor (TFET) structure is provided. The structure may include: a first-type source/drain region in a substrate adjacent to a first side of a gate stack; a second-type source/drain region in the substrate adjacent to a second side of the gate stack, wherein the second-type source/drain region has an opposite conductivity type as that of the first-type source/drain region, and wherein the second-type source/drain region has an undercut region that extends below a portion of the gate stack; an interlevel dielectric (ILD) layer on the gate stack; a first contact on the second-type source/drain region and the gate stack; and a second contact on the first-type source/drain region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

Embodiments of the present invention relate generally to integrated circuits, and more particularly to a structure and method of fabricating a heterojunction tunnel field effect transistor ("TFET") using limited lithographic steps. Conventional TFET fabrication processes may utilize two or more separate lithography processes for the formation of the two oppositely doped regions required for a TFET. In addition, further along the fabrication process, fabrication of metal contacts to the source and drain regions may require an additional third lithography. The multiple lithography steps may increase process steps and fabrication costs, reduce production yield, and reduce performance by introducing defects into the chip being fabricated. Therefore, it may be advantageous to fabricate a heterojunction TFET that involves less instances of lithography in forming source/drain regions and metal contacts thereon. Embodiments by which an opposite conductivity type source/drain region may be fabricated using the same lithography step as that used for the formation of a metal contact thereon are described below in detail with reference to FIGS. 1-13.

Figure 1:
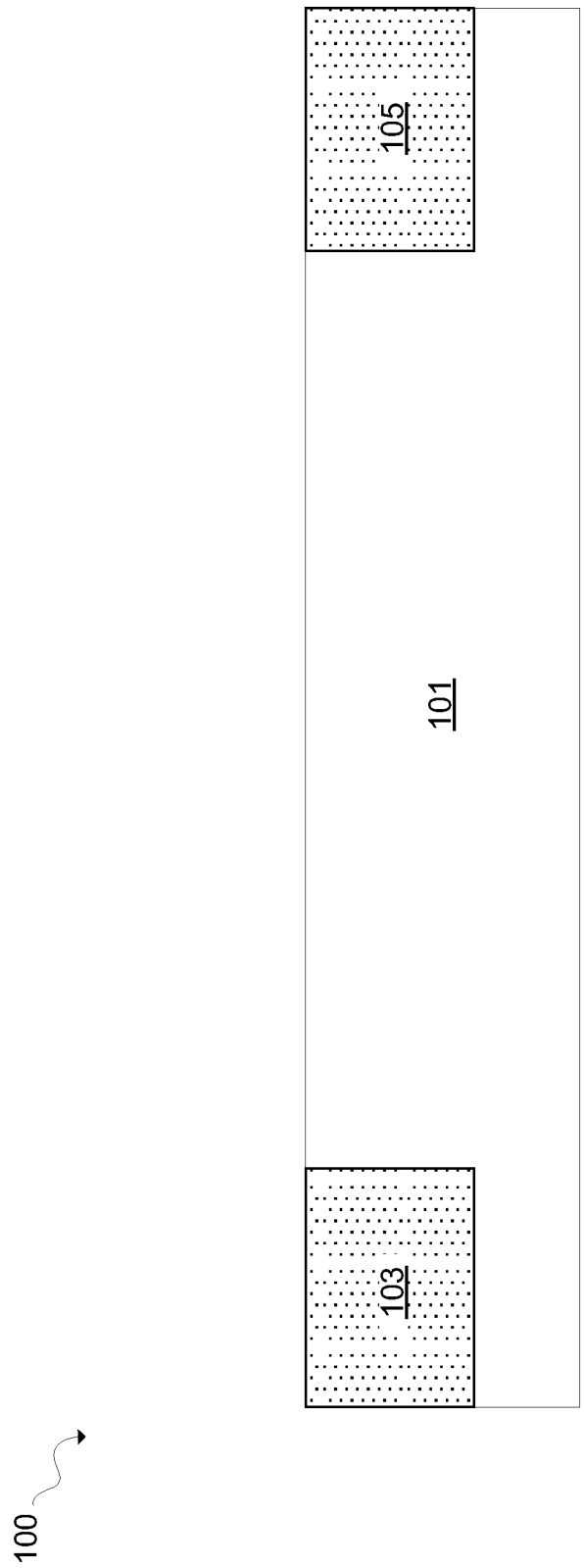
FIG. 1 is a cross section view illustrating forming isolation regions on a semiconductor substrate, according to an embodiment of the present invention.

Referring now to FIG. 1, a cross section view of a preliminary structure 100 that may be a starting point in fabricating a heterojunction TFET device is shown. In an embodiment, the structure 100 may be a fin field effect transistor (finFET) device viewed perpendicular to a fin. The structure 100 may include a substrate 101 with isolation regions 103 and 105 formed therein. The substrate 101 may be composed of any semiconductor material including, but not limited to: Si, Ge, SiGe, SiC, SiGeC, Ga, GaAs, InAs, InP and all other III/V or II/VI compound semiconductors. Substrate 101 may also be an organic semiconductor or a layered semiconductor such as Si/SiGe, a silicon-on-insulator (SOI), or a SiGe-on-insulator (SGOI). The substrate 101 may be doped, undoped or contain both doped and undoped regions therein. The substrate 101 may define the active region of the ultimate TFET device to be fabricated thereon, and may include an area in which the gate and the source/drain regions may be formed.

The isolation regions 103 and 105 may be formed in the substrate 101 to isolate the TFET device from adjoining semiconductor devices. In an embodiment, the isolation regions 103 and 105 may constitute trench isolation regions which may be formed utilizing a conventional trench isolation process well known in the art. In an embodiment, a conventional lithography and etching process may be performed to form an etched region (not shown), which may then be filled with a trench dielectric material, such as, for example, an oxide. Optionally, a liner (not shown) may be formed in the trench prior to trench fill. In an embodiment, a densification step may be performed after the trench fill. After the trench dielectric material is formed, a conventional planarization process, such as, for example, chemical mechanical planarization (CMP), may be performed.

Figure 2:
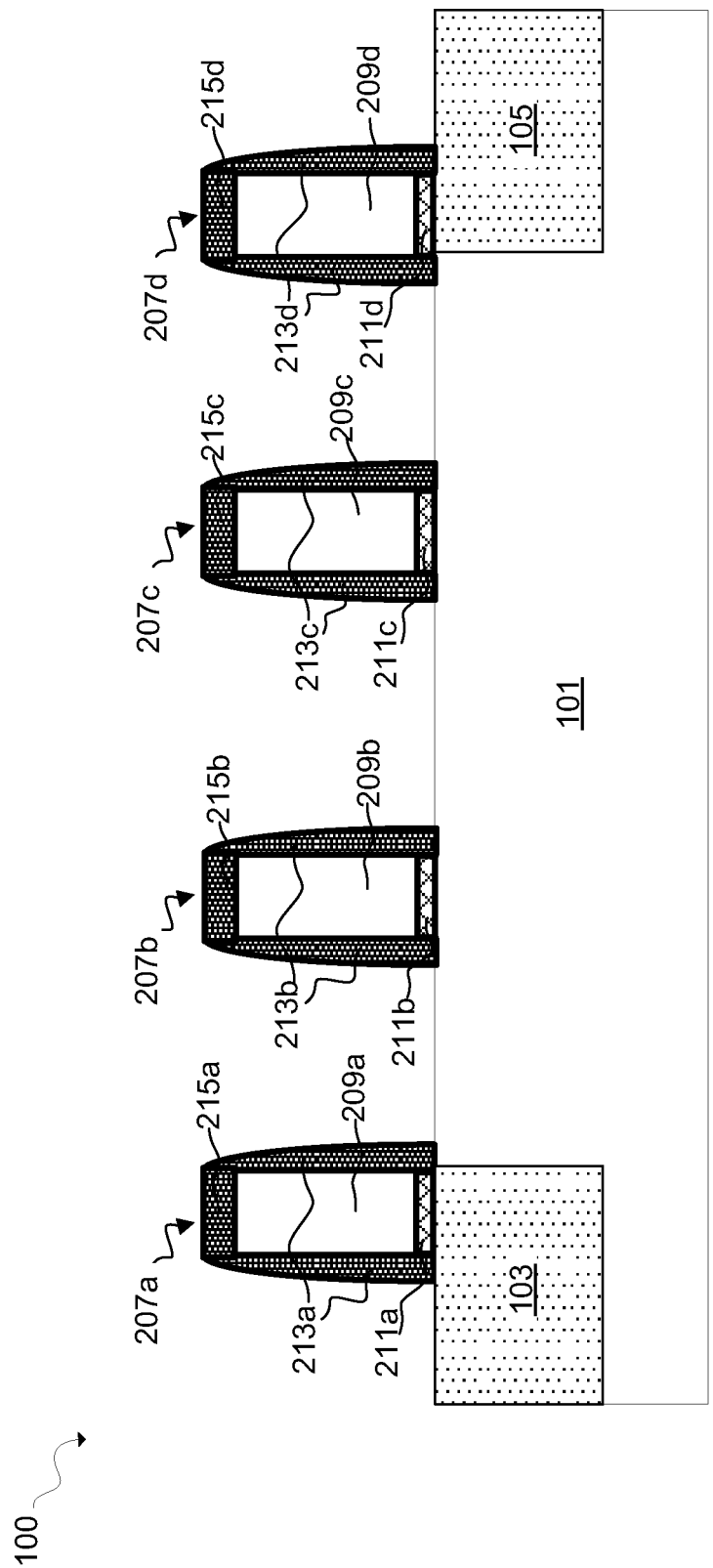
FIG. 2 is a cross section view illustrating forming gate stacks on the substrate, according to an embodiment of the present invention.

Referring now to FIG. 2, a cross section view illustrating forming gate stacks 207a-207d on an upper surface of the substrate 101 and an upper surface of the isolation regions 103 and 105 is shown. The gate stacks 207a-207d may be formed using standard CMOS processes well known in the art. The gate stacks 207a-207d may consist of gate electrodes 209a-209d formed on gate dielectric layers 211a-211d, spacers 213a-213d, and caps 215a-215d. The spacers 213a-213d and the caps 215a-215d may help prevent oxidation of the gate electrodes 209a-209d, and may also facilitate repairing or restoring stoichiometry of the gates that may get damaged or altered during gate patterning. In addition, the caps 215a-215d and the spacers 213a-213d may protect the gates during manufacturing processing.

In an embodiment, the gate dielectric layers 211a-211d may be composed of any high-k dielectric material, including, but not limited to, silicon oxide. The gate electrodes 209a-209d may be composed of a conducting metal, including, but not limited to copper. The spacers 213a-213d, and the caps 215a-215d may be composed of any suitable insulating material, including, but not limited to, a nitride, an oxide, or an oxynitride. In an embodiment, the caps 215a-215d and the spacers 213a-213d may be composed of the same material. In an embodiment, the spacers 213a-213d may have a multilayer structure. In an embodiment, gate 207a and gate 207d may be designated as dummy gates, and may serve as a boundary for the isolation regions 103 and 105.

Figure 3:
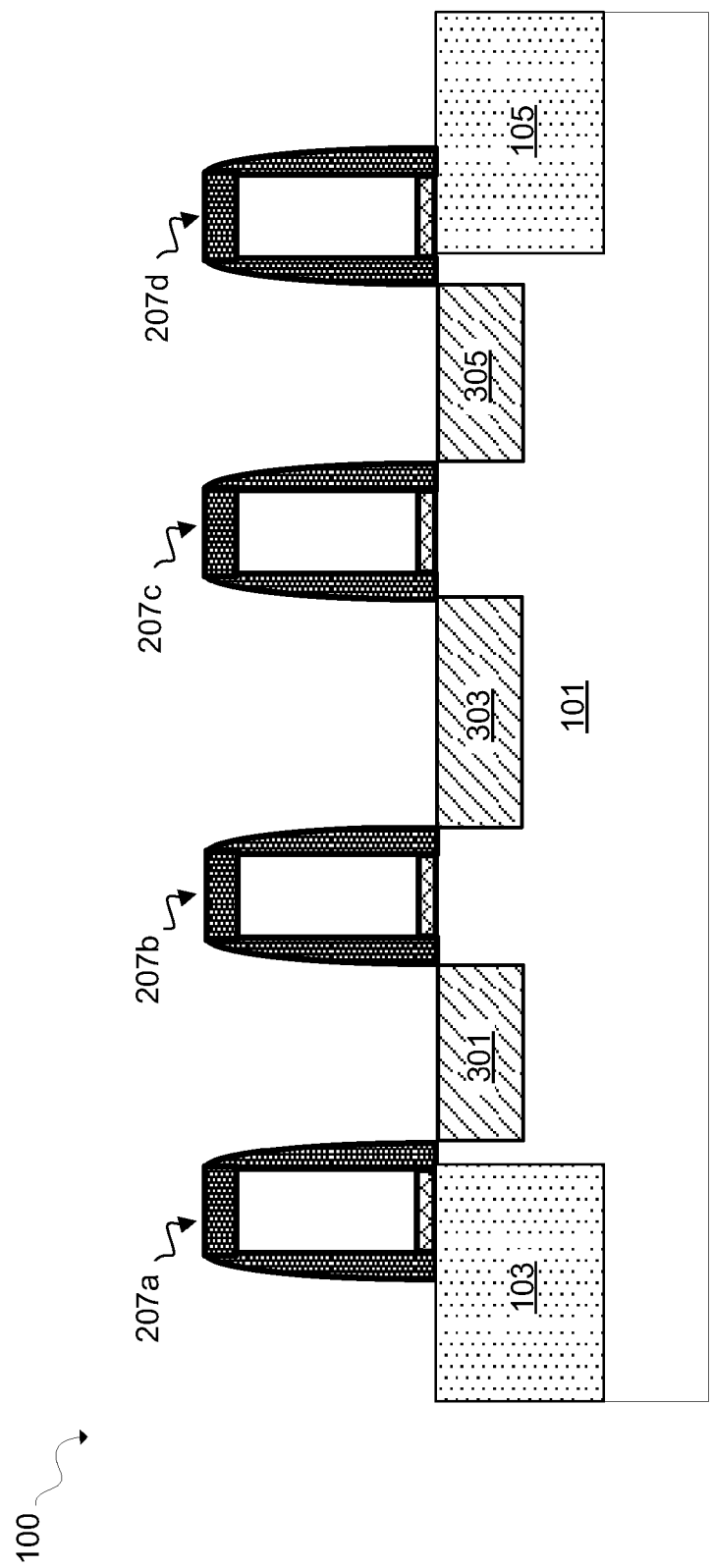
FIG. 3 is a cross section view illustrating forming first-type source/drain regions in the substrate, according to an embodiment of the present invention.

Referring now to FIG. 3, a cross section view illustrating forming first-type source/drain regions 301, 303, and 305 in the substrate 101 is shown. The first-type source/drain regions 301, 303, and 305 may be formed by first forming recesses (not shown) in the substrate 101. The recesses may be formed by removing a portion of substrate materials from certain areas using a conventional selective etching process well known in the art. In an embodiment, the recesses may be formed by selective etching using HBr containing plasma, with the etching being selective to the caps 215a-215d, the spacers 213a-213d, and the isolation regions 103 and 105. As a result, while the substrate material may be removed during the HBr etch process, the caps 215a-215d and the spacers 213a-213d may remain substantially intact. In an embodiment, the recesses may extend to a depth of approximately 200 nm from the upper surface of the substrate 101. In another embodiment, a photoresist layer (not shown) may be deposited and patterned prior to etching the recesses. The photoresist layer may be stripped subsequent to the formation of the recesses using a sulphuric acid/hydrogen peroxide solution.

The first-type source/drain regions 301, 303, and 305 may then be epitaxially grown in the recesses. The first-type source/drain regions 301, 303, and 305 may be composed of a semiconductor material such as, for example, a III-V compound semiconductor material such as InAs, or SiGe. The concentration of germanium may range from approximately 10% to approximately 99%, and preferably may range from approximately 15% to approximately 35%. In an embodiment, the epitaxial growth process may include flowing a gaseous mixture of $GeH_4$ and $SiH_4$ ($SiH_2Cl_2$) in an ambient hydrogen environment at a temperature ranging from approximately 500° C. to approximately 900° C., and under a pressure ranging from approximately 0.1 torr to approximately 100 torr. The first-type source/drain regions 301, 303, and 305 may be in-situ doped, or implanted, with either a n-type or a p-type dopant. In an embodiment, the first-type source/drain regions 301, 303, and 305 may comprise n-doped silicon germanium (SiGe). At this stage of the fabrication, each of the first-type source/drain regions 301, 303, and 305 may be of the same conductivity type (i.e., a first conductivity type).

Figure 4:
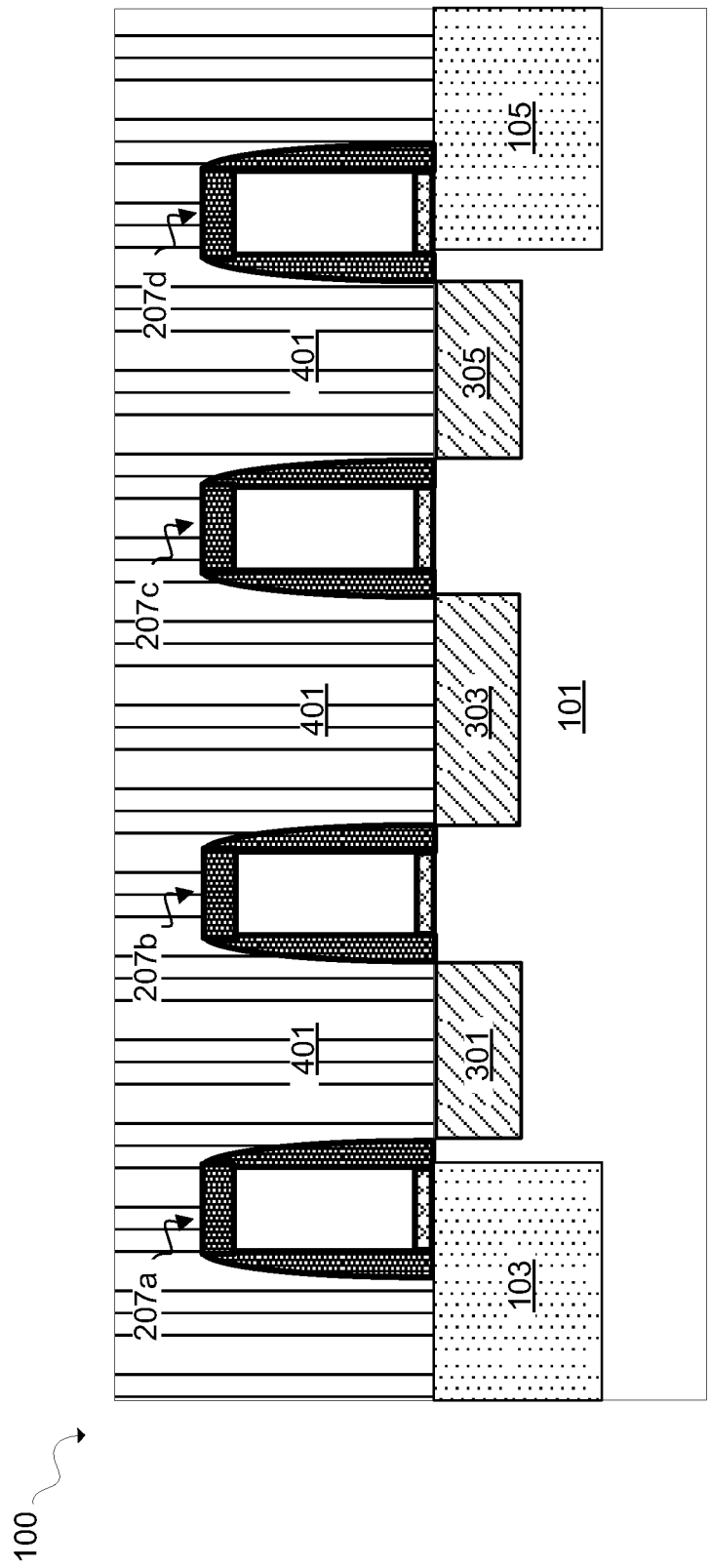
FIG. 4 is a cross section view illustrating depositing an inter-layer dielectric (ILD) layer, according to an embodiment of the present invention.

Referring now to FIG. 4, a cross section view illustrating forming an inter-layer dielectric (ILD) layer 401 is shown. The ILD layer 401 may be formed on the isolation layers 103 and 105, the first-type source/drain regions 301, 303 and 305, and the gates stacks 207a-207d. The ILD layer 401 may be formed by a conventional deposition process, such as, for example, atomic layer deposition (ALD), chemical vapor deposition (CVD), physical vapor deposition (PVD), molecular beam deposition (MBD), pulsed laser deposition (PLD), liquid source misted chemical deposition (LSMCD), or sputtering. The ILD layer 401 may be composed of any interlevel or intralevel dielectric material, including inorganic dielectrics and organic dielectrics. In an embodiment, the ILD layer 401 may be composed of a low temperature CVD oxide such as plasma oxide. In an embodiment, the ILD layer 401 may subsequently be planarized using a conventional planarization technique such as chemical mechanical planarization (CMP). The ILD layer 401 may protect the appropriate portions of the structure 100 during subsequent growth steps.

Figure 5:
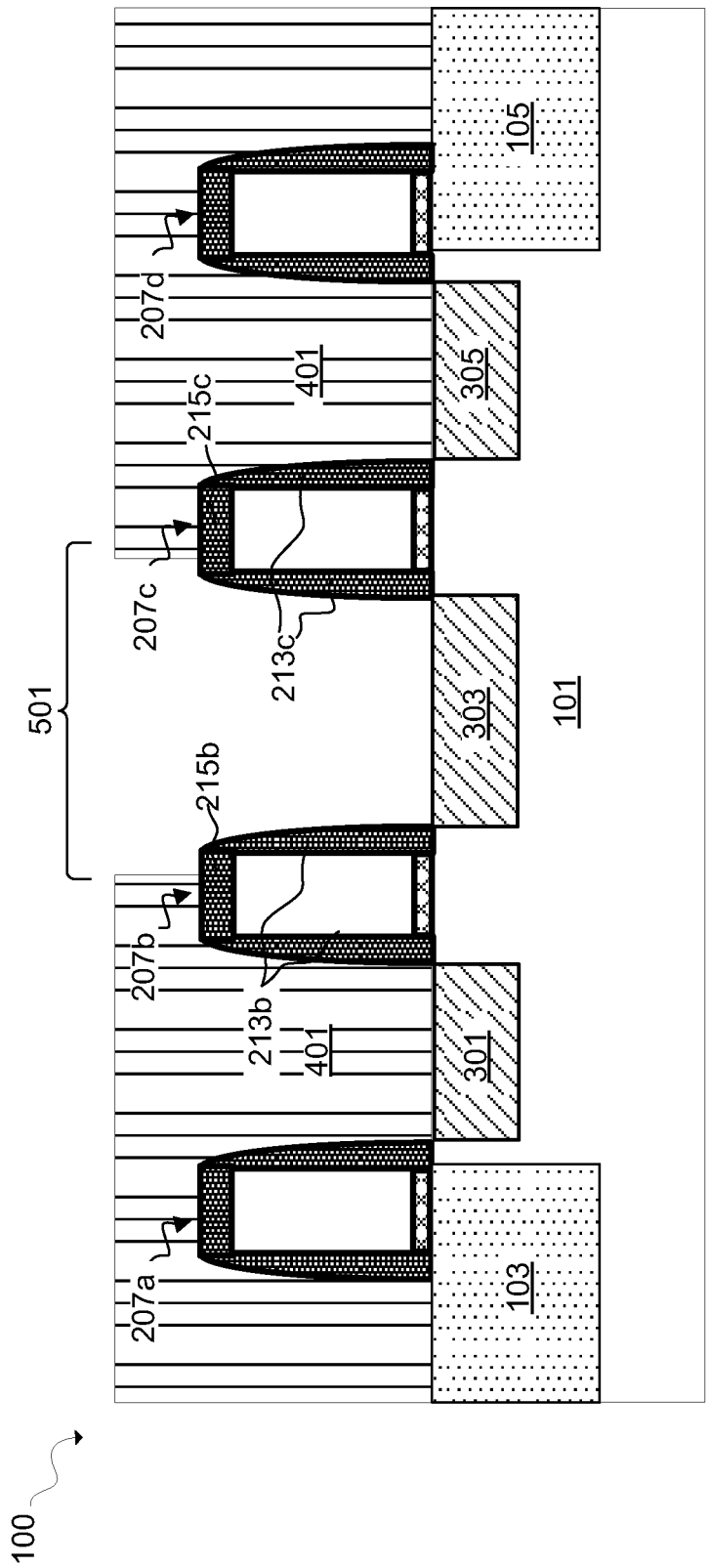
FIG. 5 is a cross section view illustrating forming an opening in the ILD layer, according to an embodiment of the present invention.

Referring now to FIG. 5, a cross section view illustrating forming an opening 501 in the ILD layer 401 is shown. The opening 501 may expose an upper surface of the first-type source/drain region 303 between the gate stack 207b and the gate stack 207c. The opening 501 may be formed using conventional masking, lithography, and anisotropic etching techniques, such as reactive ion etching (RIE). In an embodiment, the etching process may be performed by CF containing plasma etching, using, for example, a combination of $CHF_3$, $CF_4$, and oxygen as a RIE etching gas. The etching may be selective to the caps 215b and 215c, and the spacers 213b and 213c and may be stopped at the upper surface of the first-type source/drain region 303. The upper surface of the first-type source/drain region 303 may act as a natural etch stop during this etch process. In an embodiment, the opening 501 may also expose a portion of the caps 215b and 215c.

Figure 6:
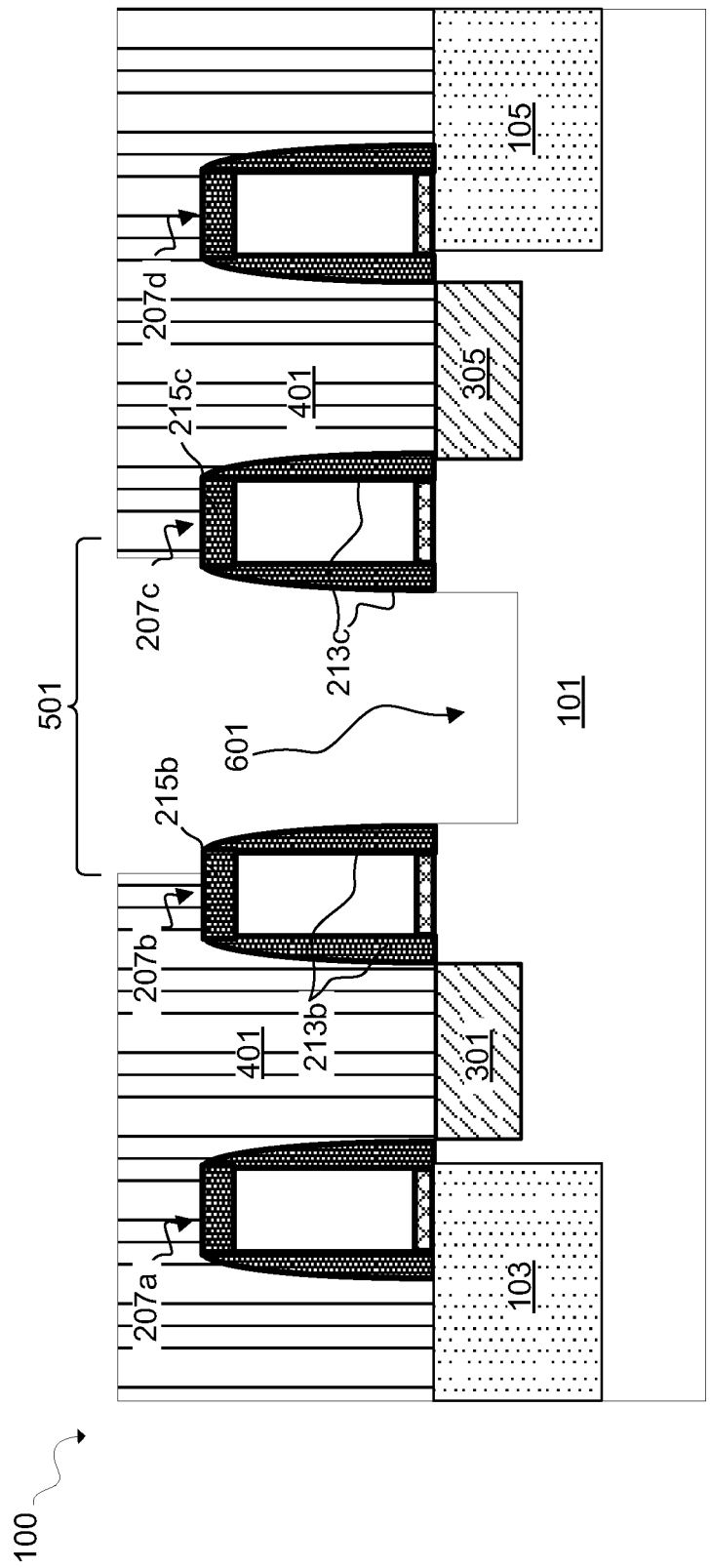
FIG. 6 is a cross section view illustrating forming a recess in the substrate, according to an embodiment of the present invention.

Referring now to FIG. 6, a cross section view illustrating removing the first-type source/drain region 303 (FIG. 5) to form a recess 601 is shown. In an embodiment, the first-type source/drain region 303 may be removed, selective to the ILD layer 401, the caps 215b and 215c, the spacers 213b and 213c, and the substrate 101 using a conventional etching process, such as a wet etch or RIE.

Figure 7:
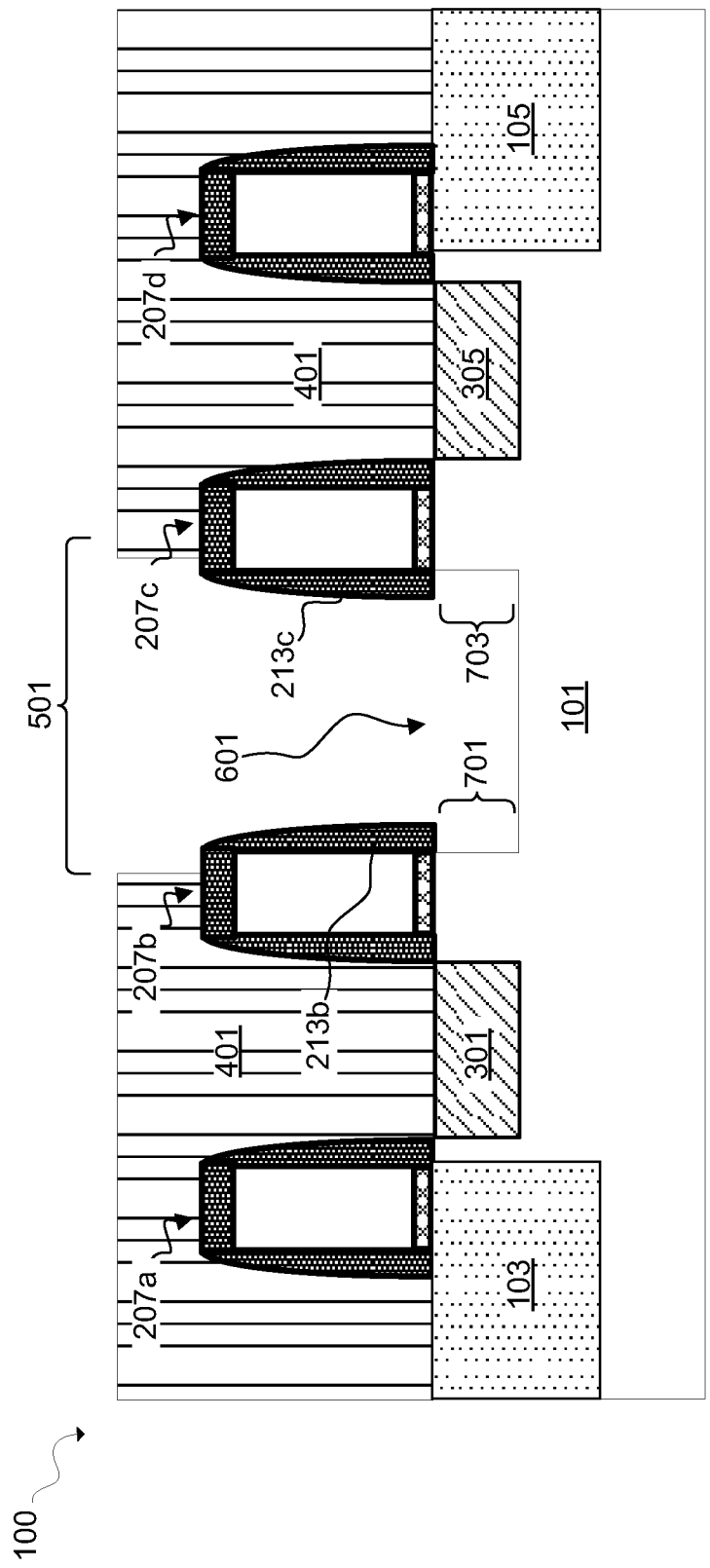
FIG. 7 is a cross section view illustrating forming undercut regions in the substrate, according to an embodiment of the present invention.

Referring now to FIG. 7, a cross section view illustrating forming undercut regions 701 and 703 in the recess 601 is shown. The undercut region 701 may extend below the gate stack 207b and the undercut region 703 may extend below the gate stack 207c. In an embodiment, the undercut regions 701 and 703 may extend below the gate stack 207b and the gate stack 207c respectively by a width that is substantially similar to the width of the spacer 213b and the spacer 213c. The undercut regions 701 and 703 may be formed using a conventional etching process that is selective to the ILD layer 401, the caps 215c and 215d, and the spacers 213b and 213b. In an embodiment, the undercut regions 701 and 703 may be formed using an intrinsic layer controllable digital etch process such as, for example, a digital electrochemical etch or a wet chemical digital etch. In an embodiment, a digital wet chemical digital etch process involving a two-step process capable of nanometer-level control may be used to directionally remove portions of the substrate 101 underneath the spacers 213b and 213c. The first step of this process may involve oxidizing portions of the substrate 101, followed by a second step that may involve removal of oxidized material using a suitable acid. This two-step process may be iterated repeatedly to achieve the designed etch results. Since the oxidation is diffusion-limited, it may be relatively process independent, enabling a high-precision process that permits removal of a single monolayer at a time. The undercut regions 701 and 703 may help reduce the TFET device's electrical resistance by providing an overlap between the gates 207b and 207c, and a second-type source/drain region 801 (FIG. 8) to be formed in the recess 601.

Figure 8:
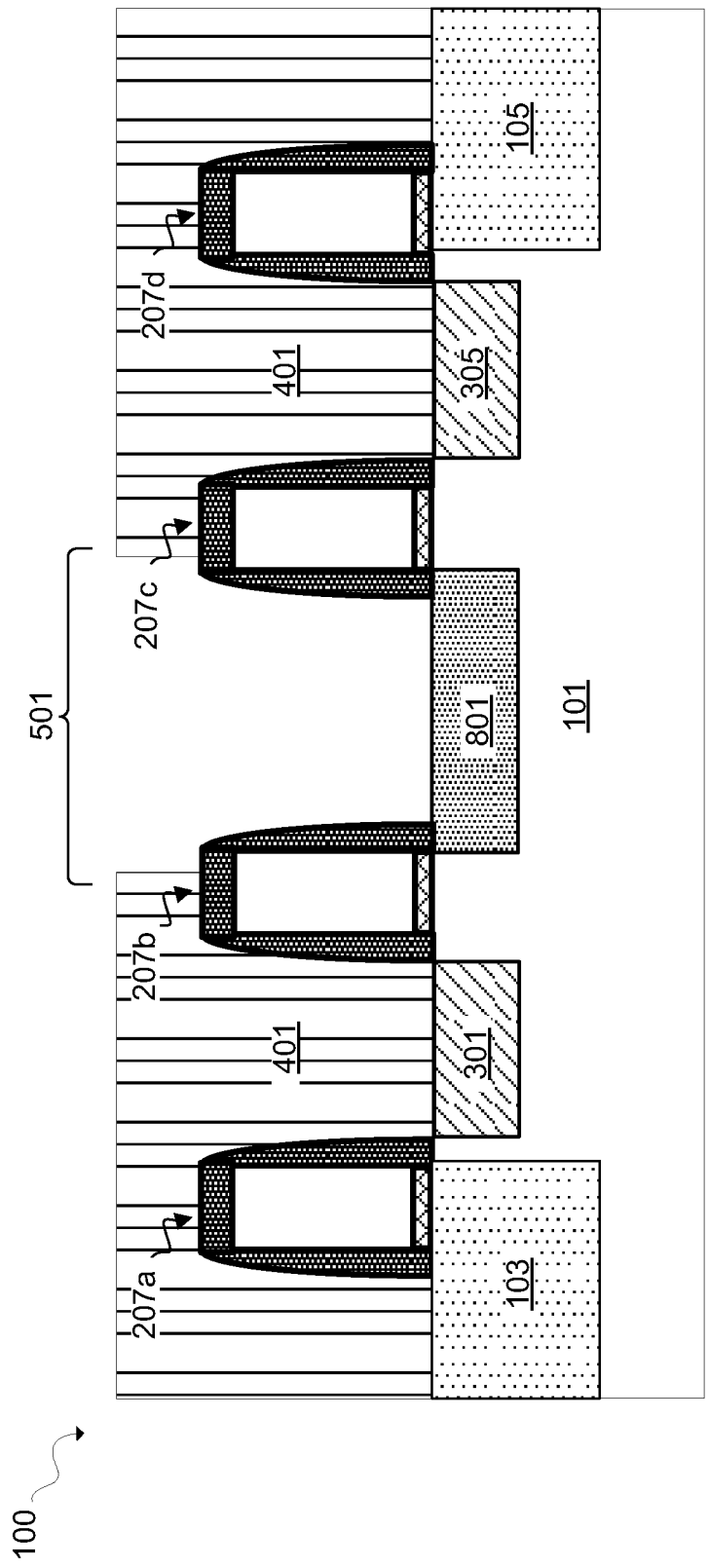
FIG. 8 is a cross section view illustrating forming a second-type source/drain region, according to an embodiment of the present invention.

Referring now to FIG. 8, a cross section view illustrating forming the second-type source/drain region 801 in the recess 601 is shown. The second-type source/drain region 801 may be of an opposite conductivity type compared to the source/drain regions 301 and 305 (i.e., a second conductivity type). In an embodiment in which the source/drain regions 301 and 305 are composed of a p-type material, the second-type source/drain region 801 may be composed of a n-type material. In an embodiment in which the source/drain regions 301 and 305 are composed of a n-type material, the second-type source/drain region 801 may be composed of a p-type material.

The second-type source/drain region 801 may be formed by growing a semiconductor material in the recess 601 using a conventional epitaxial growth process. The second-type source/drain region 801 may be composed of a semiconductor material such as, for example, a III-V compound semiconductor material such as InAs or GaSb, or SiGe. The concentration of Ge may range from approximately 10% to approximately 99%, and preferably may range from approximately 15% to approximately 35%. In an embodiment, the epitaxial growth process may include flowing a gaseous mixture of $GeH_4$ and $SiH_4$ ($SiH_2Cl_2$) in an ambient hydrogen environment at a temperature ranging from approximately 500° C. to approximately 900° C., and under a pressure ranging from approximately 0.1 torr to approximately 100 torr. The second-type source/drain region 801 may be in-situ doped, or implanted, with either a n-type or a p-type dopant. In an embodiment, the second-type source/drain region 801 may comprise p-doped gallium antimonide (GaSb). The second-type source/drain region 801 may have an upper surface that is substantially flush with the upper surface of the substrate 101.

Figure 9:
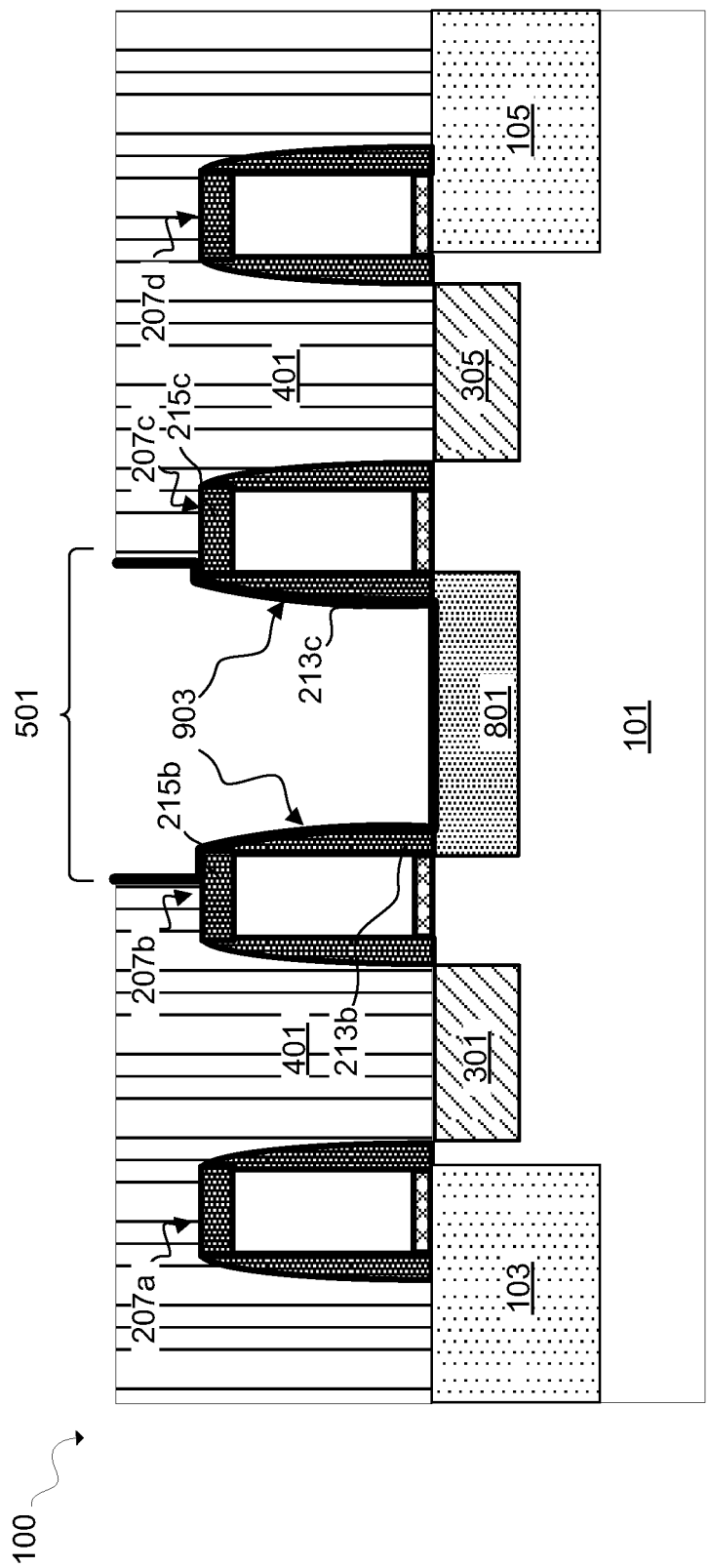
FIG. 9 is a cross section view illustrating forming a first contact liner, according to an embodiment of the present invention.

Referring now to FIG. 9, a cross section view illustrating forming a first contact liner 903 in the opening 501 is shown. The first contact liner 903 may be formed by conformally depositing a conductive liner material on exposed surfaces of the source/drain region 801, the spacers 213b and 213c, the caps 215b and 215c, and vertical surfaces of the ILD layer 401. The first contact liner 903 may be deposited by a conventional deposition process, such as, for example, physical vapor deposition (PVD), depletive chemical vapor deposition (CVD), atomic layer deposition (ALD), vacuum evaporation, or a combination thereof. In an embodiment, the first contact liner 903 may be composed of copper or a refractory metal such as titanium, tungsten, ruthenium, iridium, rhodium, or alloys/nitrides thereof. The thickness of the first contact liner 903 may range from approximately 3 nm to approximately 10 nm, although lesser and greater thicknesses may also be employed.

Figure 10:
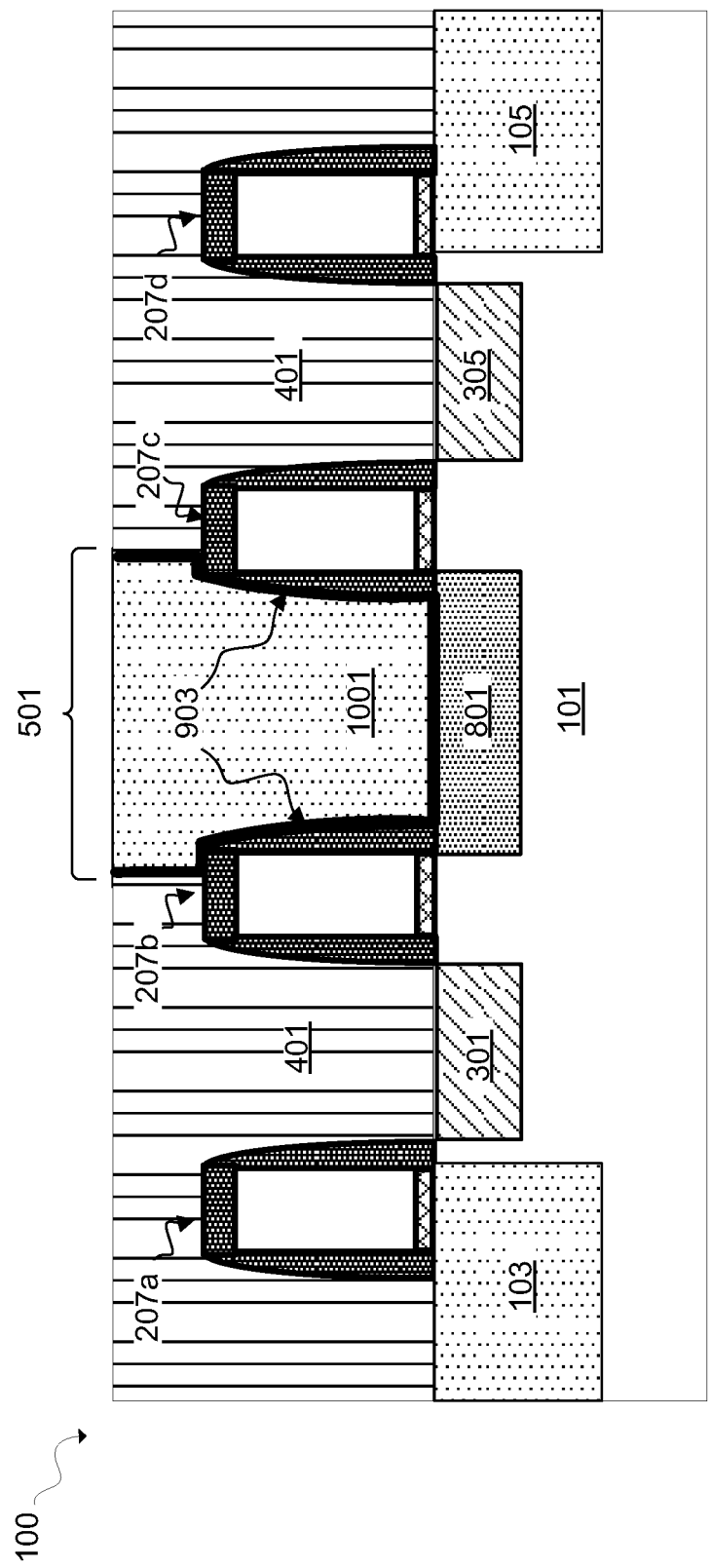
FIG. 10 is a cross section view illustrating forming a first contact, according to an embodiment of the present invention.

Referring now to FIG. 10, a cross section view illustrating forming a first contact 1001 on the first contact liner 903 is shown. The first contact 1001 may be formed by depositing a conductive material using a conventional deposition process including, but not limited to CVD, PECVD, sputtering, chemical solution deposition, or plating. After the conductive material is deposited, a conventional planarization process such as, for example, CMP, may be performed so that an upper surface of the first contact 1001 is substantially flush with the upper surface of the ILD layer 401. The first contact 1001 may be composed of, for example, polySi, a conductive metal, a conductive metal silicide, or combinations thereof. In a preferred embodiment, the first contact 1001 may be composed of a conductive metal such as Cu, W, Al, or alloys thereof. In an embodiment, the first contact 1001 may be in electrical contact with the second-type source/drain region 801.

Figure 11:
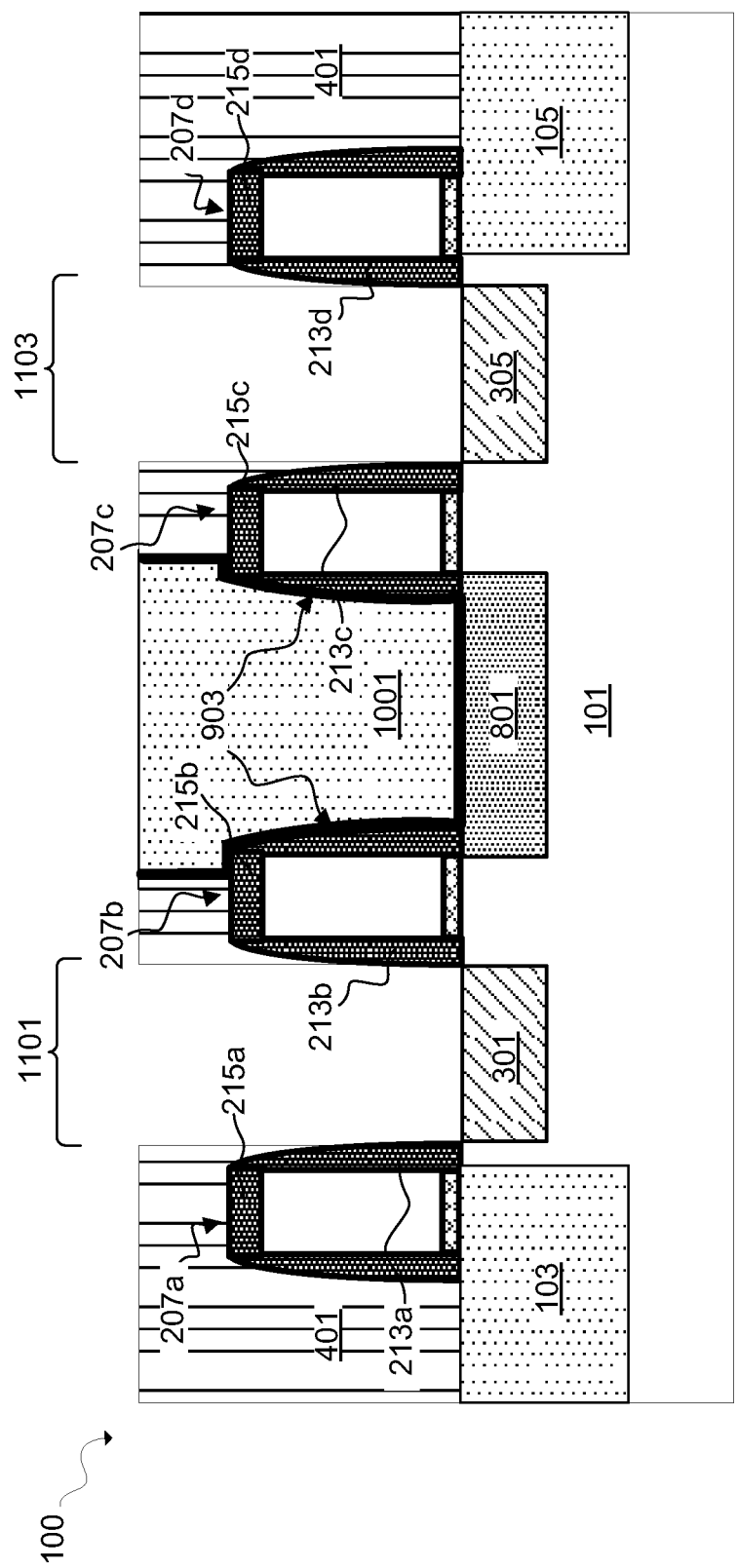
FIG. 11 is a cross section view illustrating forming additional openings in the ILD layer, according to an embodiment of the present invention.

Referring now to FIG. 11, a cross section view illustrating forming additional openings 1101 and 1103 in the ILD layer 401 is shown. The additional openings 1101 and 1103 may expose an upper surface of the source/drain regions 301 and 305 respectively. The additional openings may be formed by removing a portion of the ILD layer 401 selective to the spacers 213a-213d, the caps 215a-215d, and the source/drain regions 301 and 305. The additional openings 1101 and 1103 may be formed using substantially same techniques used to form the opening 501 (FIG. 5). In an embodiment, the additional openings 1101 and 1103 may also expose a portion of the spacers 215a-215d and caps 215a-215d.

Figure 12:
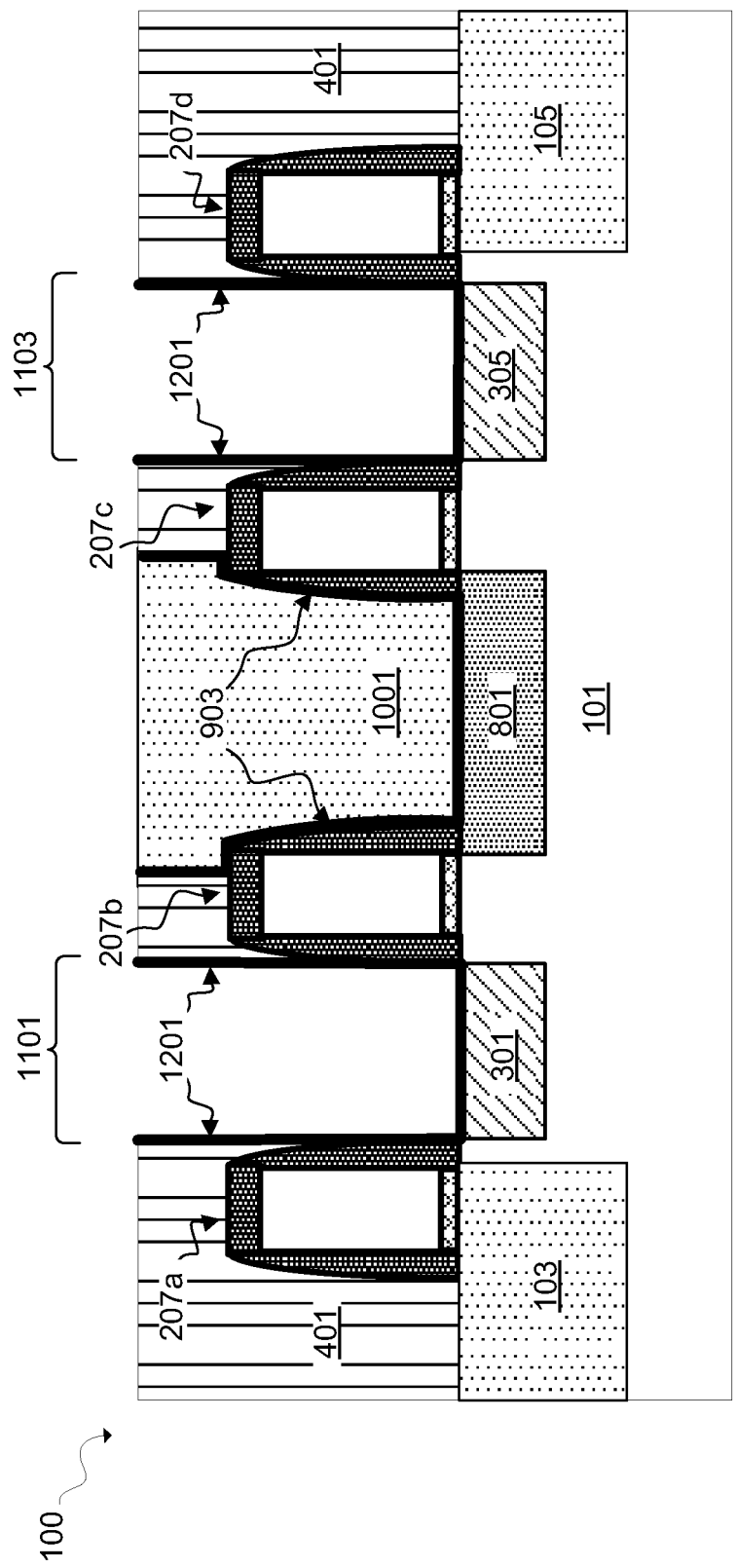
FIG. 12 is a cross section view illustrating forming a second contact liner in the additional openings, according to an embodiment of the present invention.

Referring now to FIG. 12, a cross section view illustrating forming a second contact liner 1201 in the additional openings 1101 and 1103 is shown. The second contact liner 1201 may be formed by conformally depositing a conductive liner material on exposed surfaces of the source/drains 301 and 305, the spacers 213a-213d (FIG. 11), and vertical surfaces of the ILD layer 401. In an embodiment in which a portion of the caps 215a-215d (FIG. 11) are exposed by the additional openings 1101 and 1103, the second contact liner 1201 may also be formed on the caps 215a-215d. In an embodiment, the second contact liner 1201 may be substantially similar in composition to the first contact liner 903 and may be formed using substantially similar techniques as those used to form the first contact liner 903 described above with reference to FIG. 9.

Figure 13:
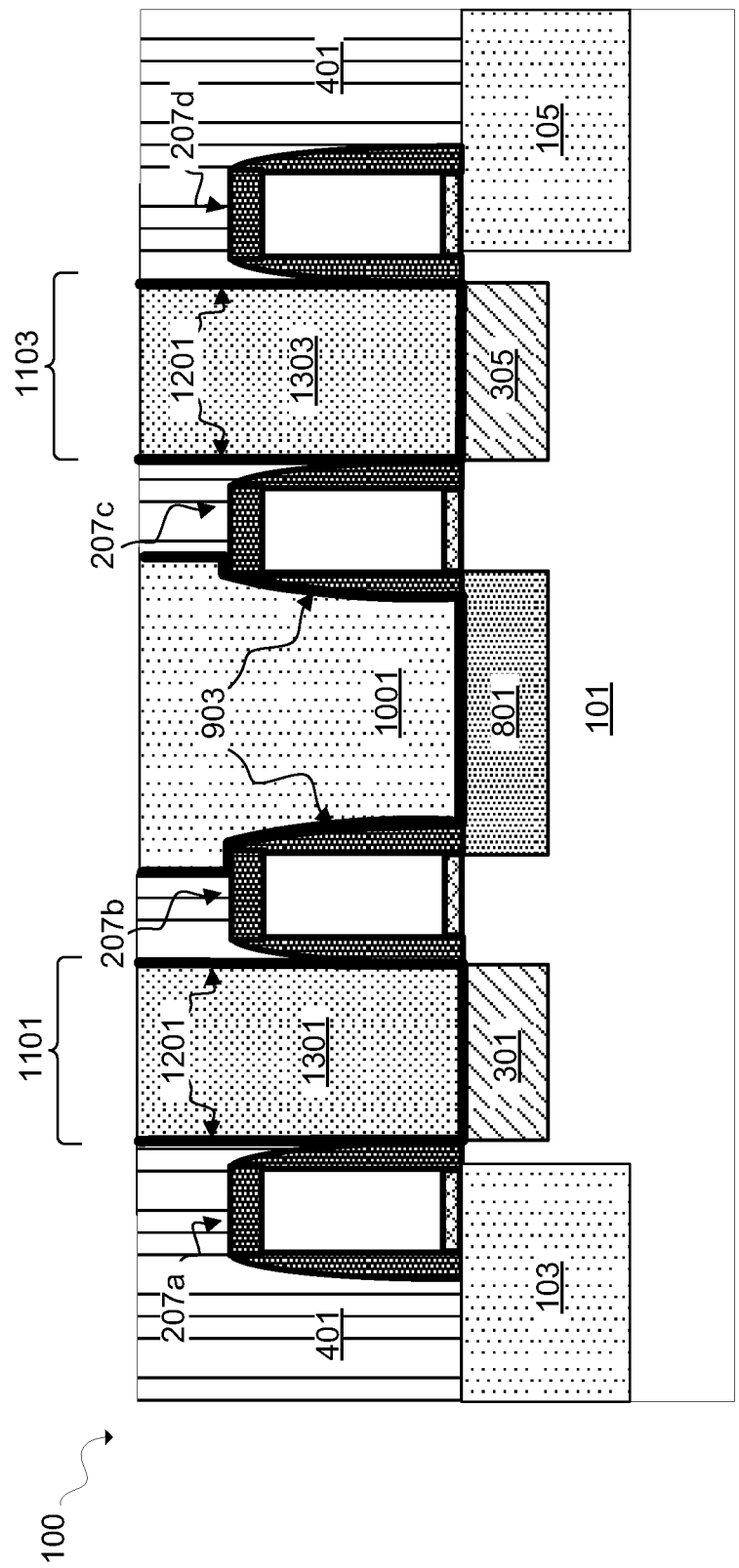
FIG. 13 is a cross section view illustrating forming second contacts, according to an embodiment of the present invention.

Referring now to FIG. 13, a cross section view illustrating forming second contacts 1301 and 1303 on the second contact liner 1201 is shown. In an embodiment, the second contacts 1301 and 1303 may be substantially similar to the first contact 1001, and may be formed using substantially similar techniques as those used to form the first contact 1001 described above with reference to FIG. 10.

Heterojunction TFETs may require source regions and drain regions to be doped differently. Conventional fabrication techniques used to form such two oppositely doped regions may involve two or more separate lithography processes. Thereafter, further along the fabrication process, additional lithography steps may be used in the fabrication of metal contacts to the source and drain regions. Each lithography step may subject semiconductor devices located in or near the lithography impacted regions to harsh processing conditions, resulting in introduction of additional defects within the wafer being fabricated, thereby reducing the yield of quality wafers in each manufactured batch. By reducing the number of lithography steps required to form the different conductivity type source/drain regions of heterojunction TFETs, embodiments of the present invention may improve device quality and performance while reducing the duration and cost associated with device fabrication.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a heterojunction tunnel field effect transistor (TFET) comprising:
   forming a gate stack on a substrate;
   forming first-type source/drain regions in the substrate on either side of the gate stack;
   forming an interlevel dielectric (ILD) layer on the gate stack and the first-type source/drain regions;
   forming a first opening in the ILD layer to expose an upper surface of one of the first-type source/drain regions;
   removing the exposed first-type source-drain region to form a recess;
   forming a second-type source/drain region in the recess, the second-type source/drain region having an opposite conductivity type as the first-type source/drain regions;
   forming a first contact liner on the second-type source/drain region, the gate stack, and a vertical sidewall of the ILD layer; and
   forming a first contact on the first contact liner.

2. The method of claim 1, further comprising:
   forming a second opening in the ILD layer to expose an upper surface of the first-type source/drain region;
   forming a second contact liner on the first-type source/drain region, the gate stack, and a vertical sidewall of the ILD layer;
   forming a second contact on the second contact liner.

3. The method of claim 1, further comprising:
   forming undercut regions in the recess, extending below the gate stack, using an intrinsic layer controllable digital etch.

4. The method of claim 1, wherein the first-type source/drain regions comprise n-doped silicon germanium (SiGe).

5. The method of claim 1, wherein the second-type source/drain region comprises p-doped gallium antimonide (GaSb).

6. The method of claim 1, further comprising:
   forming an isolation region in the substrate adjacent to the first-type source/drain region.

7. A method of claim 1, wherein the forming the gate stack on the substrate comprises:
   forming a gate dielectric layer on the substrate;
   forming a gate electrode on the gate dielectric layer;
   forming a cap on the gate electrode; and
   forming spacers on the substrate, the spacers contacting a sidewall of the gate dielectric layer, a sidewall of the gate electrode, and a sidewall of the cap.

8. The method of claim 2, wherein the first opening and the second opening are formed in a single step.

* * * * *